(12) United States Patent
Den Boef (10) Patent No.: US 8,767,183 B2
(45) Date of Patent: Jul. 1, 2014

(54) METHOD OF OVERLAY MEASUREMENT, LITHOGRAPHIC APPARATUS, INSPECTION APPARATUS, PROCESSING APPARATUS AND LITHOGRAPHIC PROCESSING CELL

(75) Inventor: Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 309 days.

(21) Appl. No.: 12/794,192

(22) Filed: Jun. 4, 2010

(65) Prior Publication Data

US 2010/0321654 A1 Dec. 23, 2010

(51) Int. Cl.
G03B 27/32 (2006.01)
G03F 7/20 (2006.01)
G03F 9/00 (2006.01)

(52) U.S. Cl.
CPC .......... *G03F 7/70633* (2013.01); *G03F 9/7046* (2013.01); *G03F 9/7065* (2013.01)
USPC ................. 355/77; 355/55; 355/67

(58) Field of Classification Search
CPC ................ G03F 7/70; G03F 70/70458; G03F 70/70466; G03F 70/70633; G03F 9/70; G03F 9/7003; G03F 9/7046; G03F 9/7065; G03F 9/7069; G03F 9/7088; G03F 9/7092
USPC .................. 355/50, 53, 55, 67, 77
See application file for complete search history.

(56) References Cited

U.S. PATENT DOCUMENTS

| | | | |
|---|---|---|---|
| 6,297,876 B1 | 10/2001 | Bornebroek | |
| 6,600,561 B2 | 7/2003 | Tabei | |
| 6,819,426 B2 | 11/2004 | Sezginer et al. | |

(Continued)

FOREIGN PATENT DOCUMENTS

| | | | |
|---|---|---|---|
| CN | 1916603 A | 2/2007 | |
| CN | 1936709 A | 3/2007 | |

(Continued)

OTHER PUBLICATIONS

International Search Report with the Written Opinion of the International Searching Authority directed to related International Application No. PCT/EP2010/057799, mailed on Dec. 9, 2010, European Patent Office, Rijswijk, Netherlands; 13 pages.

(Continued)

*Primary Examiner* — Thomas R Artman
(74) *Attorney, Agent, or Firm* — Sterne, Kessler, Goldstein & Fox P.L.L.C.

(57) ABSTRACT

In order to improve overlay measurement, product marker gratings on a substrate are measured in a lithographic apparatus by an alignment sensor using scatterometry. Then information relating to the transverse profile of the product marker grating, such as its asymmetry, is determined from the measurement. After printing an overlay marker grating on a resist film, the lateral overlay of the overlay marker grating with respect to the product marker grating is measured by scatterometry and using the determined asymmetry information in combination with a suitable process model. The alignment sensor data may be used to first reconstruct the product grating and this information is fed forward to the scatterometer that measures the stack of product and resist grating and light scattered by the stack is used for reconstruction of a model of the stack to calculate overlay. The overlay may then, optionally, be fed back to the lithographic apparatus for correction of overlay errors.

15 Claims, 7 Drawing Sheets

(56) References Cited

U.S. PATENT DOCUMENTS

| | | |
|---|---|---|
| 6,844,918 B2 * | 1/2005 | Navarro Y Koren et al. ... 355/53 |
| 6,961,116 B2 | 11/2005 | Den Boef et al. |
| 6,999,893 B2 * | 2/2006 | Matsumoto et al. .......... 702/150 |
| 7,103,497 B2 * | 9/2006 | Matsumoto et al. .......... 702/150 |
| 7,111,256 B2 | 9/2006 | Seligson et al. |
| 7,184,853 B2 | 2/2007 | Roberts et al. |
| 7,268,877 B2 * | 9/2007 | Stacker ......................... 356/401 |
| 7,342,643 B2 | 3/2008 | Park et al. |
| 7,415,319 B2 | 8/2008 | Werkman et al. |
| 7,423,725 B2 | 9/2008 | Zaal |
| 7,643,961 B2 * | 1/2010 | Matsumoto et al. .......... 702/150 |
| 7,791,727 B2 | 9/2010 | Den Boef et al. |
| 2002/0001083 A1 * | 1/2002 | Tabei ............................ 356/401 |
| 2004/0059540 A1 * | 3/2004 | Matsumoto et al. .......... 702/150 |
| 2004/0130690 A1 * | 7/2004 | Koren et al. ................... 355/53 |
| 2004/0257572 A1 * | 12/2004 | Stacker ......................... 356/401 |
| 2005/0259257 A1 * | 11/2005 | Matsumoto et al. .......... 356/401 |
| 2006/0001879 A1 | 1/2006 | Presura et al. |
| 2006/0066855 A1 | 3/2006 | Boef et al. |
| 2006/0103822 A1 * | 5/2006 | Werkman et al. .............. 355/55 |
| 2006/0206279 A1 * | 9/2006 | Park et al. ....................... 702/94 |
| 2006/0241894 A1 * | 10/2006 | Matsumoto et al. .......... 702/150 |
| 2006/0265097 A1 * | 11/2006 | Roberts et al. ................ 700/121 |
| 2007/0008533 A1 | 1/2007 | Ghinovker |
| 2007/0171392 A1 * | 7/2007 | Matsumoto .................... 355/77 |
| 2007/0201043 A1 | 8/2007 | Raymond |
| 2008/0036984 A1 | 2/2008 | Mos et al. |
| 2008/0242043 A1 * | 10/2008 | Yang ............................. 438/401 |
| 2009/0068813 A1 * | 3/2009 | Lin et al. ....................... 438/386 |
| 2009/0153825 A1 * | 6/2009 | Edart et al. ...................... 355/67 |
| 2009/0186286 A1 | 7/2009 | Ausschnitt et al. |
| 2010/0321654 A1 * | 12/2010 | Den Boef ........................ 355/53 |
| 2010/0323171 A1 * | 12/2010 | Doytcheva et al. ......... 428/195.1 |

FOREIGN PATENT DOCUMENTS

| | | |
|---|---|---|
| CN | 101059661 A | 10/2007 |
| EP | 1 628 164 A2 | 2/2006 |
| EP | 1 843 210 A2 | 10/2007 |
| JP | 2007-250578 A | 9/2007 |
| JP | 2009-500863 A | 1/2009 |
| WO | WO 03/104929 A2 | 12/2003 |

OTHER PUBLICATIONS

English-Language Abstract for Japanese Patent Publication No. 2007-250578 A, published Sep. 27, 2007; 1 page.

* cited by examiner

METHOD OF OVERLAY MEASUREMENT, LITHOGRAPHIC APPARATUS, INSPECTION APPARATUS, PROCESSING APPARATUS AND LITHOGRAPHIC PROCESSING CELL

CROSS REFERENCE TO RELATED APPLICATIONS

This application claims benefit under 35 U.S.C. §119(e) to U.S. Provisional Patent Application No. 61/187,791, filed Jun. 17, 2009, which is incorporated by reference herein in its entirety.

BACKGROUND

1. Field of the Invention

The present invention relates to measurement of overlay useable, for example, in the manufacture of devices by lithographic techniques. Specifically, the present invention relates to measuring a property of a first marker on a substrate, printing a second marker on the substrate including alignment and measuring a lateral overlay of the second marker with respect to the first marker.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Devices are built up layer by layer and overlay is a measure of a lithographic apparatus' ability to print these layers accurately on top of each other. Successive layers or multiple processes on the same layer must be accurately aligned to the previous layer, otherwise electrical contact between structures will be poor and the resulting devices will not perform to specification. Overlay is a measure of the accuracy of this alignment. Good overlay improves device yield and enables smaller product patterns to be printed. The overlay error between successive layers formed in or on the patterned substrate is controlled by various parts of the exposure apparatus (of the lithographic apparatus). It is mostly the alignment system of the lithographic apparatus that is responsible for the alignment of the radiation onto the correct portions of the substrate.

Overlay may be measured using an "image-based" (box-in-box) technique or Diffraction-Based Overlay (DBO) metrology. DBO is an emerging metrology technique used because of its superb TMU (Total Measurement Uncertainty) compared to "image-based" techniques. In the "image-based" case, overlay may be derived from a measurement of the position of a resist marker pattern relative to a marker pattern in an earlier formed product layer. In the DBO case, overlay is indirectly measured, for example by detecting variations in diffracted intensities of two overlapping periodic structures such as a top resist grating stacked over a product layer grating.

However, a problem is that the grating in the product layer can become asymmetric due to processing effects. This asymmetry is not directly measurable with known DBO techniques and it introduces an overlay measurement error that can be quite significant (nm's). It is important to note that this error does not show up in TMU measurements: one can have excellent TMU (much less than 1 nm) and still have large overlay errors due to grating asymmetry. In the "image-based" case, the asymmetry of the product layer pattern may also introduce an overlay measurement error.

Measuring asymmetry in the (bottom) product marker is not restricted to 1-dimensional periodic structures such as gratings. Asymmetry measurement may also be applied to structures that are periodic in two dimensions such as contact holes.

SUMMARY

According to an embodiment, there is provided a method of measurement of lateral overlay on a substrate of a first marker and a second marker, the method comprising: measuring on the substrate a property of the first marker that depends on a transverse profile of the first marker; determining, from the measured property of the first marker, information relating to the transverse profile of the first marker; printing, using a lithographic apparatus, the second marker on the substrate including alignment of the second marker to the substrate; measuring a lateral overlay on the substrate of the second marker with respect to the first marker using the determined information.

According to another embodiment, there is provided a lithographic apparatus for processing a substrate comprising a first marker to print a second marker on the substrate, the lithographic apparatus comprising: a measurement apparatus configured to measure a property of the first marker that depends on a transverse profile of the first marker, the measurement apparatus comprising: a first projection system configured to project a first radiation beam onto the first marker;

a first detector configured to detect first radiation from the first marker; and a first processor configured to determine the property of the first marker using the detected first radiation, the lithographic apparatus further comprising an alignment system configured to control alignment of the second marker on the substrate using the first detector as an alignment sensor; and a second processor configured to determine, from the measured property of the first marker, information relating to the transverse profile of the first marker and to output the information from the lithographic apparatus.

According to another embodiment, there is provided an inspection apparatus for measuring lateral overlay on a substrate of a first marker and a second marker, the inspection apparatus comprising: a second projection system configured to project a second radiation beam onto the first and second markers; a second detector configured to detect second radiation having interacted with the first and second markers; a third processor configured to determine the lateral overlay using the detected second radiation; and an information receiving module configured to receive information relating to the transverse profile of the first marker, wherein the inspection apparatus is configured to measure a lateral overlay on the substrate of the second marker with respect to the first marker using the received information.

According to another embodiment, there is provided a processing apparatus for processing of lateral overlay on a substrate of a first marker and a second marker, the processing apparatus comprising: a marker property receiving module configured to receive a measured property of the first marker that depends on a transverse profile of the first marker; a measurement receiving module configured to receive a lateral overlay measurement of the first and second markers; and a processor configured to determine, from the received measured property of the first marker, information relating to the transverse profile of the first marker and to determine a lateral overlay on the substrate of the second marker with respect to the first marker using the received overlay measurement and the determined information.

According to another embodiment, there is provided a lithographic processing cell comprising: a lithographic apparatus for processing a substrate comprising a first marker to print a second marker on the substrate, the lithographic apparatus comprising: a measurement apparatus configured to measure a property of the first marker that depends on a transverse profile of the first marker, the measurement apparatus comprising: a first projection system configured to project a first radiation beam onto the first marker; a first detector configured to detect first radiation from the first marker; and a first processor configured to determine the property of the first marker using the detected first radiation, the lithographic apparatus further comprising: an alignment system configured to control alignment of the second marker on the substrate using the first detector as an alignment sensor; and a second processor configured to determine, from the measured property of the first marker, information relating to the transverse profile of the first marker and to output the information from the lithographic apparatus, the lithographic processing cell further comprising: an inspection apparatus for measuring lateral overlay on the substrate of the first and second marker, the inspection apparatus comprising: a second projection system configured to project a second radiation beam onto the first and second markers; a second detector configured to detect second radiation having interacted with the first and second markers; a third processor configured to determine the lateral overlay using the detected second radiation; and an information receiving module configured to receive the information from the lithographic apparatus, wherein the inspection apparatus is configured to measure a lateral overlay on the substrate of the second marker with respect to the first marker using the received information.

According to another embodiment, there is provided a computer program product containing one or more sequences of machine-readable instructions, the instructions being adapted for controlling measuring and determining, in particular to cause one or more programmable processors to: receive a measured property of the first marker that depends on a transverse profile of the first marker; determine, from the received measured property of the first marker, information relating to the transverse profile of the first marker; and measure a lateral overlay on the substrate of the second marker with respect to the first marker using the determined information.

According to another embodiment, there is provided a computer program product containing one or more sequences of machine-readable instructions, the instructions being adapted for controlling the lithographic apparatus, in particular to cause one or more programmable processors to: receive a measured property of the first marker that depends on a transverse profile of the first marker; and determine, from the received measured property of the first marker, information relating to the transverse profile of the first marker and to output the information from the lithographic apparatus.

According to another embodiment, there is provided a computer program product containing one or more sequences of machine-readable instructions, the instructions being adapted for controlling the inspection apparatus, in particular to cause one or more programmable processors to: receive information relating to the transverse profile of the first marker; and measure a lateral overlay on the substrate of the second marker with respect to the first marker using the received information.

According to another embodiment, there is provided a computer program product containing one or more sequences of machine-readable instructions for processing of lateral overlay on a substrate of a first marker and a second marker, the instructions being adapted to cause one or more processors to: receive a measured property of the first marker that depends on a transverse profile of the first marker; receive a lateral overlay measurement of the first and second markers; determine, from the received measured property of the first marker, information relating to the transverse profile of the first marker; and determine a lateral overlay on the substrate of the second marker with respect to the first marker using the received overlay measurement and the determined information.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
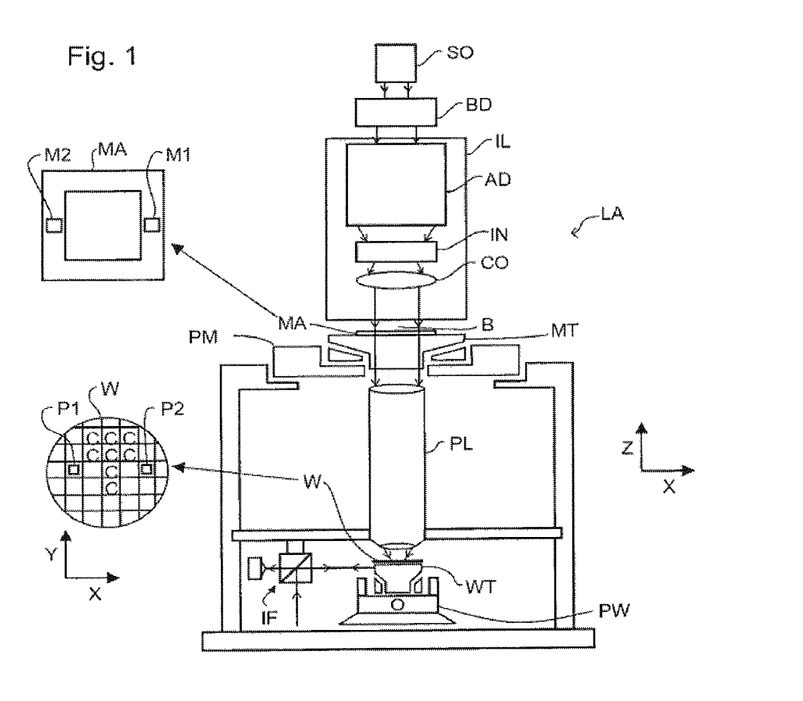
FIG. 1 depicts a lithographic apparatus.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
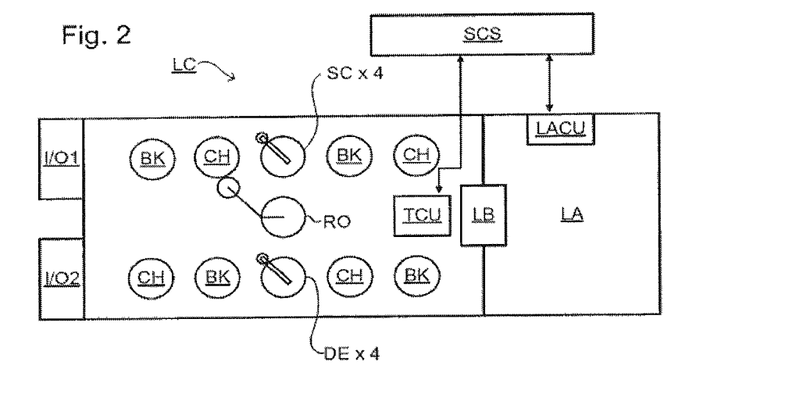
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
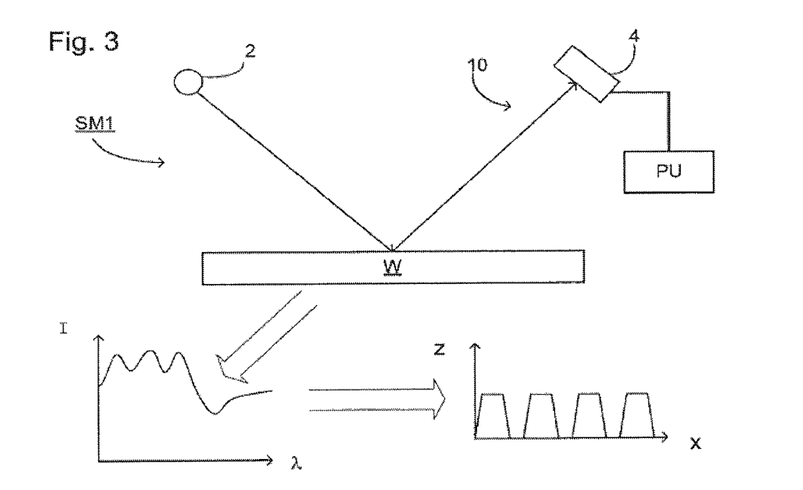
FIG. 3 depicts a first scatterometer.

FIG. 3 depicts a scatterometer SM1 which may be used in the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
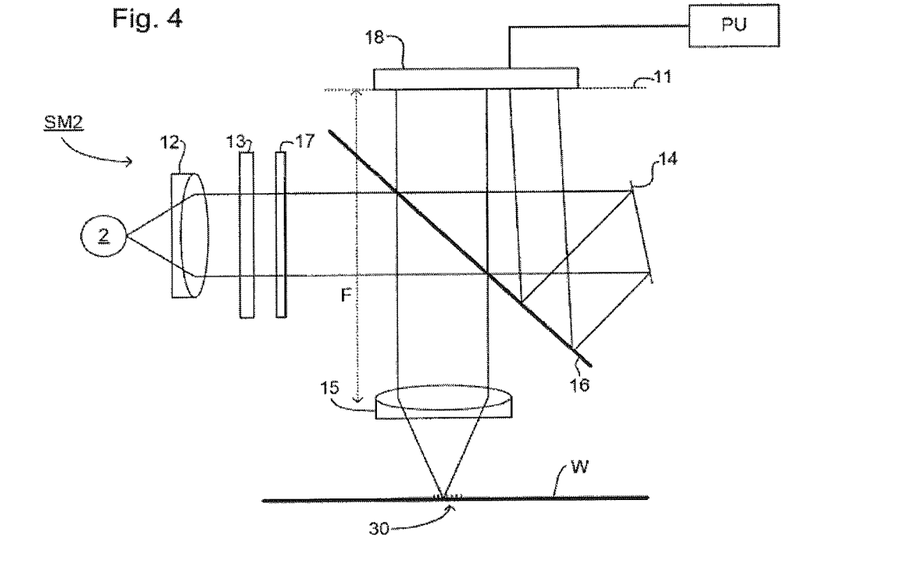
FIG. 4 depicts a second scatterometer.

Another scatterometer SM2 that may be used with the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic—and transverse electric-polarized light and/or the phase difference between the transverse magnetic—and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$, and a spacing of at least $2\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporate by reference herein in its entirety.

The target 30 on substrate W may be (a) a resist layer grating, which is printed such that after development, the bars are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

The present invention relates to embodiments of measurement of lateral overlay. In one embodiment, overlay measurement is made on a structure with a first marker and second marker. A property of the first marker, such as position variations for various wavelengths, is measured by scatterometry.

The property is one that depends on a transverse profile of the first marker. The transverse profile may have an asymmetry or a shape that affects the measured property. Information relating to the transverse profile of the first marker, such as asymmetry information, is determined from the measured property. After printing of the second marker, the overlay measurement is performed using the determined information. This has the effect of correcting the measured overlay for the effect of the transverse profile of the first marker. For example, overlay error is corrected for the effect of product grating asymmetry.

A DBO technique described in U.S. Published Patent Application No. 2006/0066855 A1, which is incorporated herein by reference, involves the use of multiple gratings where a deliberate overlay shift (or bias) has been added to the unknown overlay error.

Figure 5:
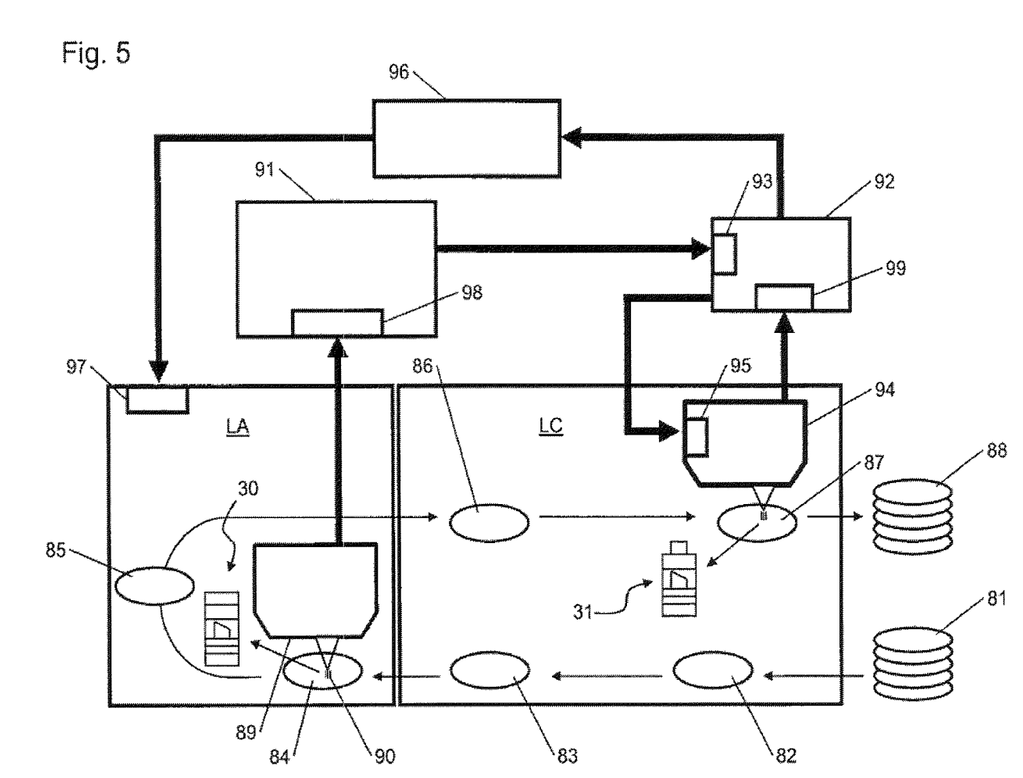
FIG. 5 depicts a lithographic cell according to an embodiment of the present invention.

With reference to FIG. 5, the exposure or lithographic apparatus LA and lithographic cell LC process a batch of input wafers 81 through various steps 82 to 87 to a set of output wafers 88. A wafer introduced into the track 82 is processed through spin coating step 83 before passing into the exposure apparatus LA. In the alignment step 84, the phase grating alignment sensor 89 projects a beam of light onto the product layer grating 90 on the wafer and detects the light scattered by the grating. The phase grating alignment sensor is a special kind of scatterometer in that it derives position information by measuring the phase difference between diffraction orders that are diffracted by the pattern on the substrate. This is what distinguishes an alignment sensor from a typical scatterometer since a typical scatterometer normally measures only intensity or polarization state of diffracted orders without considering the phase difference between different diffraction orders.

The asymmetry processor 91 determines the asymmetry of the product grating from the properties of the scattered light and feeds information about the product grating asymmetry forward to the subsequent overlay measurement. The wafer 85 is exposed with an overlay marker along with a product pattern and the resist is developed 86 to print the overlay marker on the wafer stacked on top of the product grating.

The asymmetry information is fed forward to the overlay calculation processor 92. The overlay calculation processor 92 has a receiving module 93 that receives the information about the product grating asymmetry. The information may comprise a model of the product grating profile constructed by the asymmetry processor 91. Alternatively, the overlay calculation processor 92 itself may construct a model of the product grating profile using the received information about the product grating asymmetry. In either case, the overlay calculation processor 92 constructs a model of the stacked product and overlay grating profile using or incorporating a model of the product grating profile. The stack model is then used to determine the overlay offset and us of the asymmetry information minimizes the effect of the asymmetry on the overlay offset measurement.

The metrology tool or inspection apparatus comprises scatterometer opto-mechanical sensor hardware 94 that projects a beam of light onto the stacked product and resist grating on the wafer. It detects the light that has interacted with the product and overlay gratings by scattering.

In one embodiment, the scatterometer sensor hardware 94 has an interface 95 that receives control signals from the overlay calculation processor 92. The instructions cause the scatterometer sensor 94 to adjust its measurement settings. The asymmetry information is thus used by the calculation processor to configure the wavelength and/or polarization of the beam of light so as to minimize the effect of the asymmetry on the overlay measurement. In addition, or alternatively, the information may be used to configure the detector in the scatterometer for the same purpose.

The overlay calculation processor 92 determines the overlay from the properties of the scattered light detected in the scatterometer sensor hardware 92. The overlay offset data is fed to a controller 96 that feeds corrections back to the feedback receiving module 97 of the exposure apparatus LA for correction of errors in the overlay, for example by feeding corrections into the alignment system.

Thus the product layer gratings 90 on the wafer are measured with the alignment sensor 89 before the resist is exposed at step 85. These product layer gratings 90 may also be used for wafer alignment.

The measurement by the alignment sensor 89 at step 84 may include one or more of the following measurements that are indicative of the presence of grating asymmetry:

1. measuring position variations for various wavelengths (position shift between colors);
2. measuring position variations for various orders (position shift between diffraction orders); and
3. measuring position variations for various polarizations (position shift between polarizations).

This data can for example be obtained with any type of alignment sensor, for example a SMASH (SMart Alignment Sensor Hybrid) sensor, as described in U.S. Pat. No. 6,961,116, which is incorporate by reference herein in its entirety, that employs a self-referencing interferometer with a single detector and four different wavelengths, and extracts the alignment signal in software, or Athena (Advanced Technology using High order ENhancement of Alignment), as described in U.S. Pat. No. 6,297,876, which is incorporated by reference in its entirety, which directs each of seven diffraction orders to a dedicated detector.

In addition to the measured asymmetry data, the sensor may also acquire other information that enables the identification of the type and amount of asymmetry that is present in the processed grating:

1. diffracted intensity and/or polarization state as a function of diffraction angle/order, including for multiple input polarizations; and
2. diffracted intensity and/or polarizations state as a function of wavelength, including for multiple polarizations of the illumination light.

This measured information is used to characterize the product layer grating asymmetry. This characterization may be a reconstruction of the grating profile using the same or similar techniques to those that are used in scatterometry. As discussed above, the measured product layer grating asymmetry is fed forward to the metrology tool 91 where it is used to correct the overlay metrology error that is introduced by the asymmetric bottom product layer grating. For this correction a process model is also used to obtain the correct position of the processed grating as discussed below with reference to FIG. 7. Examples of process models are models that predict the magnitude and shape of dishing and erosion that is introduced by a CMP (Chemical Mechanical Polishing) process or models that predict the shape of an etched profile that is introduced by an etch process. These process models can be empirical or based on theory.

The overlay may be obtained from the light scattered from the composite grating stack of a resist grating on top of a processed grating using the information that is obtained from the alignment sensor that measured only the processed grating. This results in a more robust measurement of the overlay since the asymmetry that is introduced by the processed grating can be correctly taken into account.

The wafer needs to be measured by an alignment sensor in order to align the wafer, so if performed by the alignment sensor, this product layer grating asymmetry measurement can be achieved without a significant penalty in extra metrology time.

The overlay calculation processor 92 may be incorporated in a metrology tool with the scatterometer 94. An alternative embodiment of the present invention is a lithographic apparatus with the asymmetry processor 91 incorporated in it. Another embodiment is an overlay processor for use with conventional lithographic apparatus and metrology tools, having a module 98 to receive measurements of the product marker, for example from a lithographic apparatus, and a module 99 to receive overlay measurements of the first and the second marker, for example from a scatterometer, and a processor performing the functions of the asymmetry processor 91 and the overlay calculation processor 92.

Figure 6:
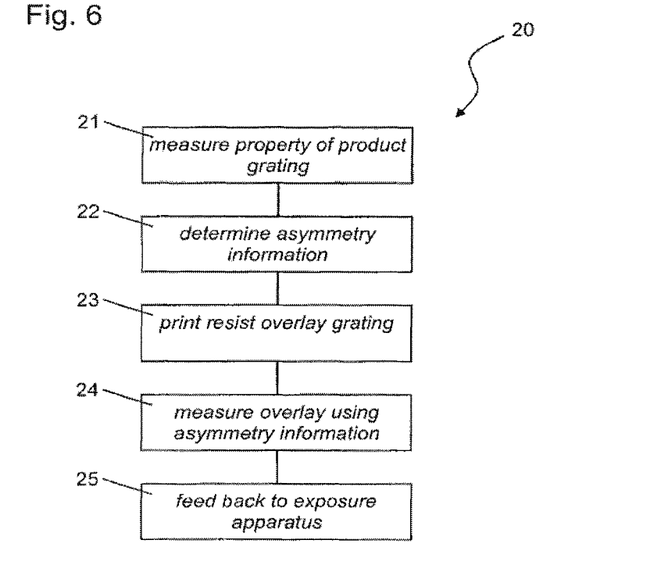
FIG. 6 depicts a flowchart of a method of measuring overlay according to an embodiment of the present invention.

FIG. 6 depicts a flowchart 20 of a method of measuring overlay offset according to an embodiment of the present invention. The method has the following steps starting with a wafer comprising product marker gratings and coated with resist: measuring 21 a property of one or more product marker gratings on a substrate, by: projecting a radiation beam onto the product markers; detecting radiation from the product markers; and determining the property of the product markers using the detected radiation; determining 22, from the measured property, information relating to the transverse profile of the product marker grating, such as its asymmetry; printing 23 an overlay marker grating on a resist film using the lithographic apparatus, including alignment of the overlay marker grating to the substrate; measuring 24 the lateral overlay on the substrate of the overlay marker grating with respect to the product marker grating by using the determined asymmetry information in combination with a suitable process model and by: projecting a radiation beam onto the marker stack; detecting radiation having interacted with the marker stack; and determining the overlay using the detected radiation. The overlay may then, optionally, be fed back 25 to the lithography apparatus for correction of overlay errors.

The product layer gratings 90 on the wafer can be measured with the alignment sensor 89 during alignment and before the resist is exposed at step 85. This is both time efficient and has the advantage of measuring the product layer gratings in their final form just before exposure of the overlay grating. However it is also possible to perform measurement of the product layer gratings at other times, for example: before or after alignment (using the alignment sensor); between coat and expose (using a different sensor and an extra metrology step); before coat (using a different sensor and an extra metrology step); and at an earlier step when the product layer is inspected, e.g., at AEI (After Etch Inspection), even though not all layers may be deposited yet (using a different sensor and an extra metrology step).

Figure 7:
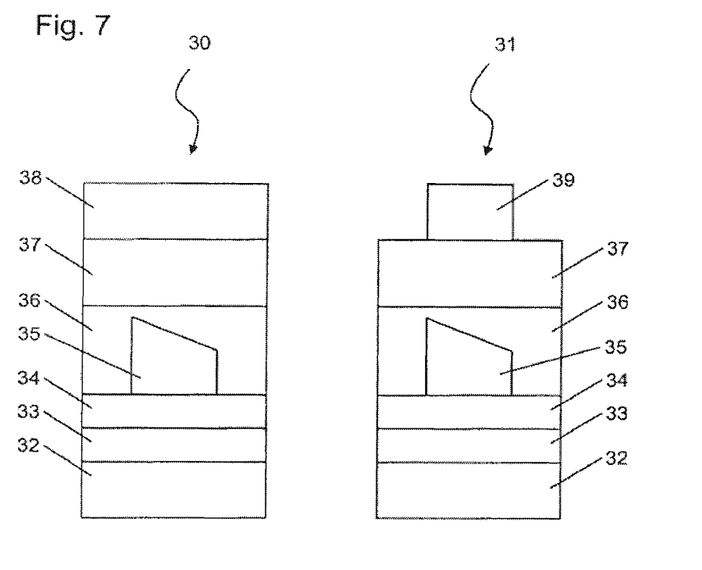
FIG. 7 depicts the profile of product marker structures having an identical asymmetric profile arising from two different processes.

FIG. 7 schematically depicts identical asymmetrical profiles of product marker structures arising from two different processes. When a grating is asymmetric its position is no longer uniquely defined. For an asymmetric processed grating, the actual position may be determined by taking into consideration the physical mechanism that has given rise to the grating deformation. In particular, a certain process can affect the left edge and right edge of a grating differently. Without a model of the process, it difficult to determine the true position. However, by considering the underlying physical processes that give rise to this left-right difference, it is possible to derive the correct position by using both the process model and the measured information obtained from the alignment sensor.

FIG. 7 illustrates how a process model can aid in determining the true position. The solid lines 40 and 41 are identical asymmetrical profiles each of one trench in a product marker grating. Different processes can give rise to different definition of the true position for each identical asymmetrical profile 40 and 41. The true position of profile 40 is the dotted line 42. In this case a first process has added material 43 to the right edge 44 only. The true position of profile 41 is the dotted line 45. In this case a second process has removed material 46 from only the right edge 47.

Figure 8:
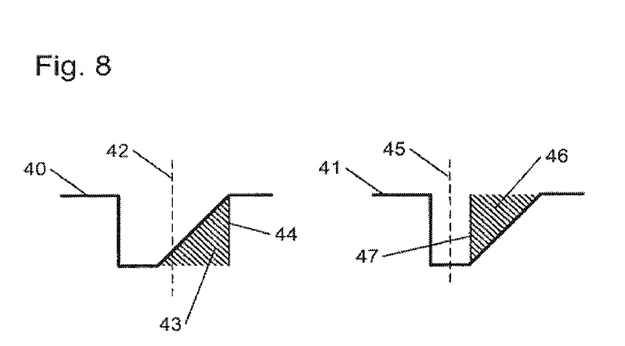
FIG. 8 depicts the profile of the stacked marker structure before exposure of the overlay grating and after develop.

FIG. 8 depicts the profile of a portion of the stacked marker structure before exposure of the overlay grating 30 and after develop 31 (that are also shown in FIG. 5). In FIG. 7, a cross section of just one bar in a grating is shown. The substrate 32 has various layers 33, 34 underlying the product marker 35, which has an asymmetric profile. The product marker 35 is covered with layers 36, 37 upon which resist layer 38 is deposited. After the exposure and develop steps, the overlay marker 39 is formed. Examples of product markers 35 are: copper lines embedded in oxide; trenches etched in silicon; and polysilicon ridges in oxide. Examples of the layers 33, 24, 36 and 37 are BARC (Bottom Anti Reflection Coating) and hardmask layers such as amorphous carbon and TEOS (TetraEthyl OorthoSilicate).

In embodiments of the present invention, alignment sensor data is used to first reconstruct the bottom product grating and this information is fed forward to the scatterometer that measures the stack of product and resist grating. Without this feeding forward, the very complicated task of reconstructing the stack is not practical, which is why the known techniques are used that have multiple gratings where a deliberate overlay shift (or bias) has been added. As mentioned above, those techniques consume extra scribe lane real estate. The feeding forward of the present invention enables model-based overlay where only one set of overlapping resist and product gratings is required and light scattered by the stack is used for reconstruction of a model of the stack. As well as allowing efficient calculation of overlay, this saves scribe line real estate.

Figure 9:
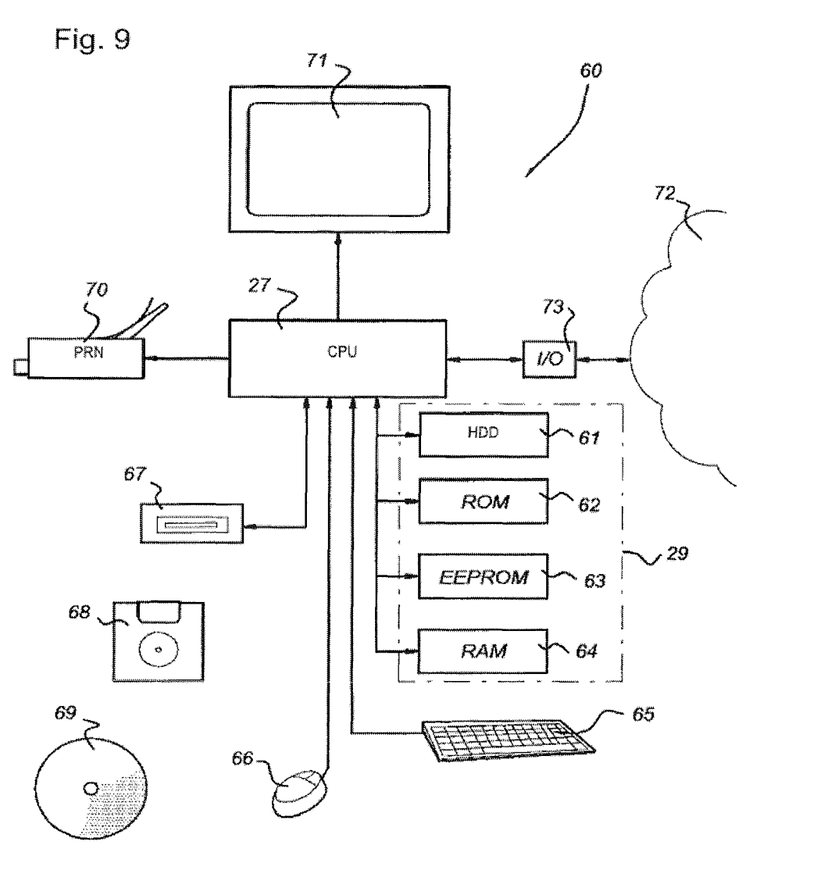
FIG. 9 depicts a computer assembly that may be used in apparatus according to an embodiment of the present invention.

It should be understood that the asymmetry processor 91 and the overlay calculation processor 92 may be implemented in one or more computer assembly 60 as shown in FIG. 9. The computer assembly 60 may be a dedicated computer in the form of an asymmetry processor 91 or an overlay calculation processor 92 in embodiments according to the invention or, alternatively, be a central computer controlling the lithographic apparatus. The computer assembly 60 may be arranged for loading a computer program product comprising computer executable code. This may enable the computer assembly 60, when the computer program product is downloaded, to control aforementioned uses of lithographic and inspection apparatuses.

The memory 29 connected to processor 27 may comprise a number of memory components like a hard disk 31, Read Only Memory (ROM) 62, Electrically Erasable Programmable Read Only Memory (EEPROM) 63 or Random Access Memory (RAM) 64. Not all aforementioned memory components need to be present. Furthermore, it is not essential that aforementioned memory components are physically in close proximity to the processor 27 or to each other. They may be located at a distance away.

The processor 27 may also be connected to some kind of user interface, for instance a keyboard 65 or a mouse 66. A touch screen, track ball, speech converter or other interfaces that are known to persons skilled in the art may also be used.

The processor 27 may be connected to a reading unit 67, which is arranged to read data, e.g., in the form of computer executable code, from and under some circumstances store data on a data carrier, like a floppy disc 68 or a CDROM 69. Also DVD's or other data carriers known to persons skilled in the art may be used.

The processor 27 may also be connected to a printer 70 to print out output data on paper as well as to a display 71, for instance a monitor or LCD (Liquid Crystal Display), of any other type of display known to a person skilled in the art.

The processor 27 may be connected to a communications network 72, for instance a public switched telephone network (PSTN), a local area network (LAN), a wide area network (WAN) etc. by means of transmitters/receivers 73 responsible for input/output (I/O). The processor 27 may be arranged to communicate with other communication systems via the communications network 72. In an embodiment of the invention external computers (not shown), for instance personal computers of operators, can log into the processor 27 via the communications network 72.

The processor 27 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 27 may even be located a distance away of the other processing units and communicate via communications network 72.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    measuring on a substrate a property of a first marker that depends on a transverse profile of the first marker;
    determining, from the measured property of the first marker, asymmetry information relating to the transverse profile of the first marker;
    printing, using a lithographic apparatus, a second marker on the substrate including alignment of the second marker to the substrate; and
    measuring a lateral overlay on the substrate of the second marker with respect to the first marker, wherein the measuring a lateral overlay includes:
        setting at least one of a wavelength and a polarization of a radiation beam based on the determined asymmetry information, and
        projecting the set radiation beam to the substrate.

2. The method according to claim 1, wherein the measuring the property of the first marker comprises:
    projecting a first radiation beam onto the first marker;
    detecting the first radiation from the first marker using an alignment sensor of a lithographic apparatus; and
    determining the property of the first marker using the detected first radiation, wherein the alignment of the second marker is performed using the alignment sensor.

3. The method according to claim 1, wherein the determining the asymmetry information comprises constructing a model of at least a portion of the first marker.

4. A lithographic apparatus comprising:
a measurement apparatus configured to measure a property of a first marker that depends on a transverse profile of the first marker, the measurement apparatus comprising:
a first projection system configured to project a first radiation beam onto the first marker;
a first detector configured to detect the first radiation from the first marker; and
a first processor configured to determine the property of the first marker using the detected first radiation,
an alignment system configured to control alignment of a second marker on the substrate using the first detector as an alignment sensor;
a second processor configured to determine, from the measured property of the first marker, asymmetry information relating to the transverse profile of the first marker and to output the asymmetry information from the lithographic apparatus; and
an inspection apparatus configured to measure a lateral overlay on the substrate of the second marker with respect to the first marker, wherein the inspection apparatus is configured to set at least one of as wavelength and a polarization of a radiation beam based on the received asymmetry information and to project the set radiation beam to the substrate.

5. The lithographic apparatus according to claim 4, wherein the second processor is configured to determine the asymmetry information by constructing a model of at least a portion of the first marker.

6. An inspection apparatus comprising:
an information receiving module configured to receive asymmetry information relating to a transverse profile of a first marker;
a processor configured to set at least one of a wavelength and a polarization of a radiation beam based on the received asymmetry information;
a projection system configured to project the set radiation beam onto the first marker and a second marker; and
a detector configured to detect radiation having interacted with the first and second markers,
wherein the processor is further configured to determine lateral overlay using the detected radiation.

7. A processing apparatus comprising:
a marker property receiving module configured to receive a measured property of a first marker that depends on a transverse profile of the first marker;
a measurement receiving module configured to receive a lateral overlay measurement of the first marker and a second marker; and
a processor configured to determine, from the received measured property of the first marker, asymmetry information relating to the transverse profile of the first marker and to determine a lateral overlay on the substrate of the second marker with respect to the first marker,
wherein the determining a lateral overlay includes setting at least one of a wavelength and a polarization of a radiation beam based on the determined asymmetry information, projecting the set radiation beam to the first and second markers, and detecting the radiation beam from the first and second markers.

8. The processing apparatus according to claim 7, wherein the processor is configured to determine the asymmetry information by constructing a model of at least a portion of the first marker.

9. A lithographic processing cell comprising:
a lithographic apparatus configured to process a substrate comprising a first marker to print a second marker on the substrate, the lithographic apparatus comprising:
a measurement apparatus configured to measure a property of the first marker that depends on a transverse profile of the first marker, the measurement apparatus comprising:
a first projection system configured to project a first radiation beam onto the first marker;
a first detector configured to detect the first radiation from the first marker; and
a first processor configured to determine the property of the first marker using the detected first radiation;
an alignment system configured to control alignment of the second marker on the substrate using the first detector as an alignment sensor; and
a second processor configured to determine, from the measured property of the first marker, asymmetry information relating to the transverse profile of the first marker and to output the asymmetry information from the lithographic apparatus,
an inspection apparatus configured to measure a lateral overlay on the substrate of the first and second marker, the inspection apparatus comprising:
an information receiving module configured to receive the asymmetry information from the lithographic apparatus;
a third processor configured to set at least one of a wavelength and a polarization of a second radiation beam based on the received asymmetry information;
a second projection system configured to project the set second radiation beam onto the first and second markers; and
a second detector configured to detect the second radiation having interacted with the first and second markers,
wherein the third processor is configured to determine the lateral overlay using the detected second radiation.

10. A non-transitory computer-readable medium having instructions stored thereon, execution of which causes a processing device to:
receive a measured property of a first marker that depends on a transverse profile of the first marker;
determine, from the received measured property of the first marker, asymmetry information relating to the transverse profile of the first marker; and
measure a lateral overlay on a substrate of a second marker with respect to the first marker, wherein the measuring a lateral overlay includes:
setting at least one of a wavelength and a polarization of a radiation beam based on the determined asymmetry information, and
projecting the set radiation beam to the substrate.

11. A non-transitory computer-readable medium having instructions stored thereon, execution of which causes a processing device to:
receive a measured property of a first marker that depends on a transverse profile of the first marker;
determine, from the received measured property of the first marker, asymmetry information relating to the transverse profile of the first marker;

set at least one of a wavelength and a polarization of a radiation beam based on the determined asymmetry information;

projecting the set radiation beam to the first marker and a second marker;

receive a lateral overlay measurement of the first marker and the second marker; and determine a lateral overlay on a substrate of the second marker with respect to the first marker using the received overlay measurement and the determined asymmetry information.

12. A non-transitory computer-readable medium having instructions stored thereon, execution of which causes a processing device to perform operations comprising:

receiving a measured property of a first marker that depends on a transverse profile of the first marker;

determining, from the received measured property of the first marker, asymmetry information relating to the transverse profile of the first marker; and measuring a lateral overlay on a substrate of a second marker with respect to the first marker, wherein the measuring a lateral overlay includes:

setting at least one of as wavelength and a polarization of a radiation beam based on the determined asymmetry information, and projecting the set radiation beam to the substrate.

13. A non-transitory computer-readable medium having instructions stored thereon, execution of which causes a processing device to perform operations comprising:

receiving a measured property of a first marker that depends on a transverse profile of the first marker;

determining, from the received measured property of the first marker, asymmetry information relating to the transverse profile of the first marker and to output the asymmetry information setting at least one of a wavelength and a polarization of a radiation beam based on the determined asymmetry information;

projecting the set radiation beam to the substrate; and measuring a lateral overlay a substrate of a second marker with respect to the first marker.

14. A non-transitory computer-readable medium having instructions stored thereon, the instructions comprising:

instructions to receive asymmetry information relating to a transverse profile of a first marker; and instructions to measure a lateral overlay on a substrate of a second marker with respect to the first marker, wherein the instructions to measure a lateral overlay includes:

instructions to set at least one of a wavelength and a polarization of a radiation beam based on the received asymmetry information, and instructions to project the set radiation beam to the substrate.

15. A non-transitory computer-readable medium having instructions stored thereon, the instructions comprising:

instructions to receive a measured property of a first marker that depends on a transverse profile of the first marker;

instructions to determine, from the received measured property of the first marker, asymmetry information relating to the transverse profile of the first marker;

instructions to set at least one of a wavelength and a polarization of a radiation beam based on the determined asymmetry information;

instructions to project the set radiation beam to the first marker and a second marker;

instructions to receive a lateral overlay measurement of the first marker and the second marker; and instructions to determine a lateral overlay on a substrate of the second marker with respect to the first marker using the received overlay measurement and the determined asymmetry information.

* * * * *

UNITED STATES PATENT AND TRADEMARK OFFICE
CERTIFICATE OF CORRECTION

PATENT NO. : 8,767,183 B2  
APPLICATION NO. : 12/794192  
DATED : July 1, 2014  
INVENTOR(S) : Den Boef Page 1 of 1

It is certified that error appears in the above-identified patent and that said Letters Patent is hereby corrected as shown below:

In the Claims

Column 17, line 28, claim 4, after "one of", please delete "as" and insert --a--  
Column 19, line 24, claim 12, after "one of", please delete "as" and insert --a--  
Column 20, line 5, claim 13, after "overlay", please insert --on--

Signed and Sealed this  
Eleventh Day of November, 2014

Michelle K. Lee  
*Deputy Director of the United States Patent and Trademark Office*